United States Patent
Ishigaki et al.

(10) Patent No.: US 11,040,402 B2
(45) Date of Patent: Jun. 22, 2021

(54) SURFACE-COATED CUTTING TOOL HAVING HARD COATING LAYER EXHIBITING EXCELLENT CHIPPING RESISTANCE AND WEAR RESISTANCE

(71) Applicant: MITSUBISHI MATERIALS CORPORATION, Tokyo (JP)

(72) Inventors: Takuya Ishigaki, Naka (JP); Sho Tatsuoka, Naka (JP); Kenichi Sato, Naka (JP); Kousuke Yanagisawa, Naka (JP); Shin Nishida, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/478,776

(22) PCT Filed: Jan. 17, 2018

(86) PCT No.: PCT/JP2018/001145
§ 371 (c)(1),
(2) Date: Jul. 17, 2019

(87) PCT Pub. No.: WO2018/135513
PCT Pub. Date: Jul. 26, 2018

(65) Prior Publication Data
US 2019/0358711 A1    Nov. 28, 2019

(30) Foreign Application Priority Data

Jan. 18, 2017 (JP) .............................. JP2017-006406
Jan. 4, 2018 (JP) .............................. JP2018-000211

(51) Int. Cl.
| | | |
|---|---|---|
| *B32B 27/14* | (2006.01) | |
| *C23C 16/34* | (2006.01) | |
| *C23C 16/38* | (2006.01) | |
| *B23B 27/14* | (2006.01) | |
| *C23C 16/36* | (2006.01) | |

(52) U.S. Cl.
CPC ............ *B23B 27/148* (2013.01); *C23C 16/34* (2013.01); *C23C 16/36* (2013.01); *B23B 2224/08* (2013.01); *B23B 2224/32* (2013.01); *B23B 2224/36* (2013.01); *B23B 2228/105* (2013.01)

(58) Field of Classification Search
CPC . B23B 27/148; B23B 27/14; B23B 2228/105; B23B 2228/36; B23B 2228/32; B23B 2228/08; C23C 16/36; C23C 16/34; C23C 28/044; C23C 28/042; C23C 30/005; B23C 5/16
See application file for complete search history.

(56) References Cited

U.S. PATENT DOCUMENTS

| | | | | |
|---|---|---|---|---|
| 7,422,806 B2* | 9/2008 | Osada | ..................... | C23C 16/32 407/119 |
| 2007/0172675 A1* | 7/2007 | Omori | ................... | C23C 30/005 428/469 |
| 2015/0158094 A1* | 6/2015 | Igarashi | ................ | C23C 28/044 428/216 |
| 2016/0333473 A1 | 11/2016 | Stiens et al. | | |
| 2017/0216930 A1 | 8/2017 | Sato et al. | | |

FOREIGN PATENT DOCUMENTS

| | | | | |
|---|---|---|---|---|
| CN | 104858458 A | 8/2015 | | |
| CN | 105073313 A | 11/2015 | | |
| EP | 3135412 A1 | 3/2017 | | |
| EP | 3213840 A1 | 9/2017 | | |
| JP | 2006-082207 A | 3/2006 | | |
| JP | 2015-163423 A | 9/2015 | | |
| JP | 2015-163424 A | 9/2015 | | |
| JP | 2015214015 A * | 12/2015 | ............... | B23C 5/16 |
| JP | 2016-068252 A | 5/2016 | | |
| WO | WO-2015/135802 A1 | 9/2015 | | |
| WO | WO-2016/148056 A1 | 9/2016 | | |

OTHER PUBLICATIONS

"Superior oxidation resistance, mechanical properties and residual stresses of an Al-rich nanolamellar Ti0.05Al0.95N coating prepared by CVD", Todt et al., Surface and Coatings Technology, vol. 258, Nov. 15, 2014, pp. 1119-1127 (Todt) (Year: 2014).*

(Continued)

*Primary Examiner* — Daniel J. Schleis
*Assistant Examiner* — Kevin CT Li
(74) *Attorney, Agent, or Firm* — Leason Ellis LLP

(57) ABSTRACT

A surface-coated cutting tool including at least a TiAlCN layer, in which the layer is expressed by a composition formula: $(Ti_{1-X}Al_X)(C_YN_{1-Y})$, an average content ratio X of Al and an average content ratio Y of C (here, X and Y are atomic ratios) satisfy $0.60 \leq X \leq 0.95$ and $0 \leq Y \leq 0.005$, respectively, an average content ratio Z of Cl in the total amount of atoms configuring the TiAlCN phase (here, Z is an atomic ratio) satisfies $0.0001 \leq Z \leq 0.004$, plane spacings d(111) and d(200) are respectively calculated from X-ray diffraction spectra of (111) plane and (200) plane of crystal grains having a NaCl type face-centered cubic structure in the TiAlCN layer measured by using an X-ray diffraction device, and an absolute value $\Delta A = |A(111) - A(200)|$ defined as $A(111) = 3^{1/2}d(111)$ and $A(200) = 2d(200)$ satisfies $0.007$ Å $\leq \Delta A \leq 0.05$.

5 Claims, No Drawings

(56) References Cited

OTHER PUBLICATIONS

"Design of CVD Coatings for Cutting Tools", Christoph Czettl, Thesis for Doctor of Montanistic Sciences at Montanuniversität Leoben , Nov. 2013 (Czettl) (Year: 2013).*
Todt et al., "Superior oxidation resistance, mechanical properties and residual stresses of an Al-rich nanolamellar $Ti_{0.05}Al_{0.95}N$ coating prepared by CVD", *Surface &Coatings Technology*, Jul. 11, 2014, 258, pp. 1119-1127.
International Search Report dated Apr. 17, 2018 for the corresponding PCT Patent Application No. PCT/JP2018/001145.
Chinese Office Action dated Apr. 1, 2020 for the corresponding Chinese Patent Application No. 201880007281.X.
European Search Report dated Aug. 13, 2020 for the corresponding European Patent Application No. 18741099.8.

* cited by examiner

SURFACE-COATED CUTTING TOOL HAVING HARD COATING LAYER EXHIBITING EXCELLENT CHIPPING RESISTANCE AND WEAR RESISTANCE

CROSS-REFERENCE TO RELATED PATENT APPLICATIONS

This application is a U.S. National Phase Application under 35 U.S.C. § 371 of International Patent Application No. PCT/JP2018/001145, filed Jan. 17, 2018, and claims the benefit of Japanese Patent Applications No. 2017-006406, filed on Jan. 18, 2017 and No. 2018-000211, filed Jan. 4, 2018, all of which are incorporated herein by reference in their entirety. The International Application was published in Japanese on Jul. 26, 2018 as International Publication No. WO/2018/135513 under PCT Article 21(2).

FIELD OF THE INVENTION

The present invention relates to a surface-coated cutting tool (hereinafter, referred to as a coated tool), which has a hard coating layer exhibiting excellent chipping resistance and wear resistance during high-speed intermittent cutting of alloy steel or the like, and the cutting tool exhibits excellent cutting performance for long-term use in which high-temperature heat is generated and impact loads are exerted on a cutting edge.

BACKGROUND OF THE INVENTION

In the related art, in general, coated tools in which the surfaces of tool bodies made of tungsten carbide (hereinafter, referred to as WC)-based cemented carbide, titanium carbonitride (hereinafter, referred to as TiCN)-based cermet, or a cubic boron nitride (hereinafter, referred to as cBN)-based ultra-high-pressure sintered material (hereinafter, collectively referred to as a tool body) are covered with a Ti—Al-based layer of complex nitride as a hard coating layer through a physical vapor deposition method are known, and it is known that these coated tools exhibit excellent wear resistance.

However, although the coated tool coated with the Ti—Al-based layer of complex nitride in the related art has relatively excellent wear resistance, in a case of using the coated tool under high-speed intermittent cutting conditions, abnormal wear such as chipping easily occurs. Therefore, various methods to improve the hard coating layer have been suggested.

For example, Japanese Unexamined Patent Application, First Publication No. 2015-163423 discloses a coated tool in which chipping resistance of a hard coating layer is increased during high-speed intermittent cutting of stainless steel or the like during which high-temperature heat is generated and impact loads are exerted on a cutting edge. The coated tool is made by forming a hard coating layer having a NaCl type face-centered cubic structure and containing at least a TiAlCN layer expressed by a composition formula: $(Ti_{1-X}Al_X)(C_YN_{1-Y})$ (here, an average composition $X_{avg}$ of Al satisfies $0.60 \leq X_{avg}$ 0.95, an average composition $Y_{avg}$ of C satisfies 0 $Y_{avg}$ 0.005 in terms of atomic ratio) on a surface of a tool body. When the inclined angle frequency distribution of the TiAlCN layer is acquired by measuring inclined angles formed by a normal line of a {111} plane of TiAlCN crystal grains with respect to a normal direction of the surface of the tool body by using an electron beam backward scattering diffraction device, a highest peak is present in a inclined angle section in a range of 0 to 12 degrees, a total of frequencies in the range of 0 to 12 is 45% or more of all of the frequencies in the inclined angle frequency distribution. The coated tool has a structure in which the area percentage of facets, which have triangle shapes in the plane orthogonal to layer thickness direction of the TiAlCN layer and is formed of equivalent crystal planes represented by {111} of the crystal grains, is 35% or more of the entire surface in the surface orthogonal to the layer thickness direction.

As well as Japanese Unexamined Patent Application, First Publication No. 2015-163423, in order to increase chipping resistance of the hard coating layer during high-speed intermittent cutting of stainless steel or the like during which high-temperature heat is generated and impact loads are exerted on a cutting edge, Japanese Unexamined Patent Application, First Publication No. 2015-163424 discloses a coated tool in which a hard coating layer containing at least a TiAlCN layer having a NaCl type face-centered cubic structure expressed by a composition formula: $(Ti_{1-X}Al_X)(C_YN_{1-Y})$ (here, an average composition $X_{avg}$ of Al satisfies $0.60 \leq X_{avg} \leq 0.95$, an average composition $Y_{avg}$ of C satisfies $0 \leq Y_{avg} \leq 0.005$ in terms of atomic ratio) on a surface of a tool body. When a inclined angle frequency distribution of the TiAlCN layer is acquired by measuring inclined angles formed by a normal line of a {100} plane of TiAlCN crystal grains with respect to a normal direction of the surface of the tool body by using an electron beam backward scattering diffraction device, a highest peak is present in a inclined angle section in a range of 0 to 12 degrees, a total of frequencies in the range of 0 to 12 is 45% or more of all of the frequencies in the inclined angle frequency distribution. The TiAlCN layer has a structure in which polygonal facets not having an angle less than 90 degrees are provided in the plane orthogonal to layer thickness direction of the TiAlCN layer, the facets are formed of one of the equivalent crystal planes represented by {100} of the crystal grains, and an area percentage of the facet is 50% or more of the entire surface in the surface orthogonal to the layer thickness direction.

In the coated tool, when XRD analysis is performed regarding the TiAlCN layer, and if a relationship of Ic{200}/Ih{200}≥3.0 between a peak strength Ic{200} derived from a cubic structure and a peak strength Ih{200} derived from a hexagonal structure is satisfied, it is described that an effect of wear resistance improvement is further increased.

PCT International Publication No. WO 2015/135802 discloses, in order to improve wear resistance of the tool, a coated tool in which a wear-resistant coating layer having a thickness of 3 to 25 μm formed by CVD is formed on a tool body. The wear-resistant coating layer includes a TiAlCN layer which has a thickness of 1.5 to 17 μm and satisfies 0.70≤x<1, 0≤y<0.25 and 0.75≤z<1.15, in a case where the coating layer is expressed by $Ti_{1-X}Al_XC_YN_Z$. The layer has a lamellar structure having a lamellar spacing less than 150 nm, the cutting edge is formed of $Ti_{1-X}Al_XC_YN_Z$ layers in which Ti and Al respectively have different chemical quantities, and the layers are periodically mutually disposed. At least 90 vol % or more of the $Ti_{1-X}Al_XC_YN_Z$ layers has a face-centered cubic structure, the TC value of the layer satisfies TC(111)>1.5, and the full width at half maximum of an X-ray diffraction peak intensity of the {111} plane is smaller than 1 degree.

Technical Problem

There has been a strong demand for power saving and energy saving during cutting in recent years. In accordance with this, there is a trend toward a further increase in speed and efficiency during cutting. Therefore, abnormal damage resistance such as chipping resistance, fracture resistance, and peeling resistance is further required for a coated tool, and excellent wear resistance is required during long-term use.

However, in the coated tools disclosed in Japanese Unexamined Patent Application, First Publication No. 2015-163423, Japanese Unexamined Patent Application, First Publication No. 2015-163424, and PCT International Publication No. WO 2015/135802, chipping resistance and wear resistance are not sufficient and it cannot be said that satisfied cutting performance is obtained, during high-speed intermittent cutting of alloy steel or the like during which high-temperature heat is generated and impact loads are exerted on cutting edges.

Here, an object of the present invention is to solve the aforementioned problem and provide a coated tool which exhibits excellent chipping resistance and wear resistance during long-term use, even in a case of being provided for high-speed intermittent cutting of alloy steel or the like.

SUMMARY OF THE INVENTION

Solution to Problem

The present inventors intensively studied to improve the chipping resistance and wear resistance of a coated tool in which a hard coating layer containing at least a layer of complex nitride or complex carbonitride of Ti and Al (hereinafter, sometimes referred to as "TiAlCN" or "$(Ti_{1-X}Al_X)(C_YN_{1-Y})$") is provided on a surface of a tool body, and, as a result, the following knowledge was obtained.

That is, in a case where TiAlCN crystal grains configuring the TiAlCN layer are formed as a columnar structure extending in a direction perpendicular to a tool body, the TiAlCN layer has high toughness, but hardness is not sufficient. Accordingly, in order to obtain a coated tool having both characteristics of chipping resistance and wear resistance, it is desired to improve wear resistance of the TiAlCN layer.

The present inventors have intensively studied about lattice strain of each crystal lattice of the TiAlCN crystal grains configuring the TiAlCN layer, and have found that, in a case where the TiAlCN layer contains crystal grains having a NaCl type face-centered cubic structure, X-ray diffraction is performed regarding the crystal grains having the NaCl type face-centered cubic structure to calculate plane spacing of (111) plane and (200) plane to obtain d(111) and d(200), and an absolute value ΔA of values of a difference between lattice constant A(111) and A(200) each calculated from d(111) and d(200) is 0.007 to 0.05 Å, a hardness of the TiAlCN layer can be increased, and as a result, wear resistance of the TiAlCN layer is improved.

Therefore, it is found that, in a case where ΔA measured regarding the crystal grains having a NaCl type face-centered cubic structure of the TiAlCN layer is 0.007 to 0.05 Å, both characteristics of excellent chipping resistance and wear resistance were obtained during high-speed intermittent cutting of alloy steel or the like.

The present invention is made based on the above-described knowledge and has the following aspects:

(1) A surface-coated cutting tool including: a tool body composed of any one of a tungsten carbide-based cemented carbide, a titanium carbonitride-based cermet and a cubic boron nitride-based ultra-high-pressure sintered material; and a hard coating layer provided on a surface of the tool body, wherein (a) the hard coating layer includes at least a layer of complex nitride or complex carbonitride of Ti and Al having an average thickness of 1 to 20 μm, and in a case where the complex nitride or the complex carbonitride is expressed by a composition formula:

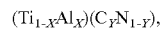
$(Ti_{1-X}Al_X)(C_YN_{1-Y})$,

X and Y satisfy 0.60≤X≤0.95 and 0≤Y≤0.005, respectively, where X is an average content ratio of Al in a total amount of Ti and Al in an atomic ratio, and Y is an average content ratio of C in a total amount of C and N in an atomic ratio, (b) the complex nitride or complex carbonitride contains a minute amount of Cl, and Z satisfies 0.0001 Z 0.004, where Z is a content ratio of Cl in a total amount of Ti, Al, C, N, and Cl in an atomic ratio, (c) in a case where values of spacing of plane d(111) and d(200) are respectively calculated from X-ray diffraction spectra of (111) plane and (200) plane of crystal grains having a NaCl type face-centered cubic structure in the layer of complex nitride or complex carbonitride measured by using an X-ray diffraction device, regarding the layer of complex nitride or complex carbonitride, A(111) and A(200) defined as $A(111)=3^{1/2}d(111)$ and $A(200)=2d(200)$ were calculated from the calculated values of d(111) and d(200), and an absolute value ΔA of a difference between A(111) and A(200), $ΔA=|A(111)-A(200)|$ satisfies 0.007 Å≤ΔA≤0.05 Å.

(2) The surface-coated cutting tool according to the above-described (1), in which, in a case where the layer of complex nitride or complex carbonitride is observed in a longitudinal sectional direction, the layer has a columnar structure in which an average grain width W of each crystal grain having a cubic structure in the layer of complex nitride or complex carbonitride is 0.10 to 2.00 μm, and an average aspect ratio A is 2.0 to 10.0.

(3) The surface-coated cutting tool according to the above-described (1) or (2), further comprising a lower layer between the tool body and the layer of the complex nitride or the complex carbonitride of Ti and Al, wherein the lower layer includes a Ti compound layer having one or more of: a Ti carbide layer; Ti nitride layer; Ti carbonitride layer; Ti oxycarbide layer; and Ti oxycarbonitride layer, the Ti compound layer having an average total thickness of 0.1 to 20 μm.

(4) The surface-coated cutting tool according to any one of the above-described (1) to (3), further comprising an upper layer above the layer of the complex nitride or the complex carbonitride, wherein the upper layer includes at least an aluminum oxide layer, the upper layer having an average total thickness of 1 to 25 μm.

The present invention will be further described below.

Average Layer Thickness of TiAlCN Layer:

The hard coating layer of the present invention includes at least the TiAlCN layer expressed by the composition formula: $(Ti_{1-X}Al_X)(C_YN_{1-Y})$. This TiAlCN layer has high hardness and excellent wear resistance, and the effect thereof is significantly exhibited particularly in a case where the average layer thickness thereof is 1 to 20 μm. The reason for this is that in a case where the average layer thickness thereof is less than 1 μm, the layer thickness thereof is too small to sufficiently ensure wear resistance during long-term use, and in a case where the average layer thickness thereof is more than 20 μm, the crystal grains of the TiAlCN layer are likely to coarsen and chipping easily occurs.

Therefore, the average layer thickness thereof is set to 1 to 20 μm.

Average Composition of TiAlCN Layer:

The TiAlCN layer is controlled such that an average content ratio X of Al in the total amount of Ti and Al (hereinafter, referred to as an "average content ratio of Al") and an average content ratio Y of C in the total amount of C and N (hereinafter, referred to as an "average content ratio of C") satisfy $0.60 \leq X \leq 0.95$ and $0 \leq Y \leq 0.005$, respectively (here, both X and Y are atomic ratios).

The reason for this is that in a case where the average content ratio X of Al is less than 0.60, the hardness of the TiAlCN layer decreases. Therefore, in a case where the layer is provided for high-speed intermittent cutting of alloy steel or the like, the wear resistance thereof is insufficient. On the other hand, in a case where the average content ratio X of Al is more than 0.95, the amount of Ti is relatively reduced, resulting in embrittlement and a reduction in chipping resistance.

Therefore, the average content ratio X of Al is set to $0.60 \leq X \leq 0.95$.

In a case where the average content ratio Y of C included in the TiAlCN layer is a small amount in a range of $0 \leq Y \leq 0.005$, adhesion between the TiAlCN layer and the tool body or the lower layer is improved and lubricity thereof is improved. Thus, an impact during cutting is relieved, resulting in an improvement in the chipping resistance and fracture resistance of the TiAlCN layer. On the other hand, in a case where the average content ratio Y of C is beyond the range of $0 \leq Y \leq 0.005$, toughness of the TiAlCN layer decreases. Accordingly chipping resistance and fracture resistance in contrast, decrease, which is not preferable.

Therefore, the average content ratio Y of C is set to $0 \leq Y \leq 0.005$.

At the time of forming the TiAlCN layer, $AlCl_3$ and $TiCl_4$ are used as reactant gas components, and thus, a small amount of Cl is necessarily included in the TiAlCN layer. In a case where an average content ratio Z of Cl in the total amount of Ti, Al, C, N, and Cl (here, $Z=Cl/(Ti+Al+C+N+Cl)$, and Z is an atomic ratio) is a small amount in a range of 0.0001 Z 0.004, and lubricity can be improved without decreasing the toughness of the layer. However, in a case where the average chlorine content is less than 0.0001, the effect of lubricity improvement is small, and on the other hand, in a case where the average chlorine content is more than 0.004, chipping resistance decrease, which is not preferable.

Therefore, the average content ratio Z of Cl is set to 0.0001 Z 0.004.

Index of Lattice Strain of TiAlCN Crystal Grains Having NaCl Type Face-Centered Cubic Structure (hereinafter, also simply referred to as "cubic") Configuring TiAlCN Layer:

In the present invention, a lattice strain is positively introduced into the cubic TiAlCN crystal grains of the TiAlCN layer to improve the hardness of the TiAlCN layer.

The introduction of the lattice strain can be performed, for example, by controlling a film forming condition of the TiAlCN layer.

For example, at the time of forming the TiAlCN layer, the lattice strain can be introduced into the layer at the same time of the formation of the TiAlCN layer, by a thermal CVD method using $NH_3$.

The specific description is as follows.

In a chemical vapor deposition apparatus used, a gas group A of $NH_3$ and $H_2$ and a gas group B of $TiCl_4$, $AlCl_3$, $N_2$, $Al(CH_3)_3$, and $H_2$ are supplied into the reaction apparatus from separate gas supply tubes, the supplying of the gas group A and the gas group B into the reaction apparatus is performed so that, for example, the gases are allowed to flow at time intervals of a predetermined period only for a shorter time than the period, the supplying of the gases of the gas group A and the gas group B has a phase difference of a time shorter than the time for which the gases are supplied, the reaction gas is supplied to the surface of the tool body, and the chemical vapor deposition is performed by adjusting the supply amount of each gas component so that a supply ratio $N_2/(AlCl_3+Al(CH_3)_3)$ regarding $N_2$, $AlCl_3$, and $Al(CH_3)_3$ which are gas components becomes a suitable value, to form the TiAlCN layer to which a predetermined lattice strain is introduced.

In a case where the supply ratio $N_2/(AlCl_3+Al(CH_3)_3)$ is great, ΔA tends to increase.

Here, specific conditions of the chemical vapor deposition are as follows.

Reaction gas composition (volume % with respect to all of gas group A and gas group B):

Gas group A: $NH_3$: 2% to 6%, $H_2$: 65% to 75%

Gas group B: $AlCl_3$: 0.5% to 0.9%, $TiCl_4$: 0.2% to 0.3%, $N_2$: 3.0% to 12.0%, $Al(CH_3)_3$: 0.0% to 0.1%, $H_2$: the balance Reaction atmosphere pressure: 4.5 to 5.0 kPa Reaction atmosphere temperature: 700° C. to 900° C.

Supply period: 6 to 9 seconds gas supply time per one period: 0.15 to 0.25 seconds phase difference in supply between gas group A and gas group B: 0.10 to 0.20 seconds Regarding the formation of the TiAlCN layer by the thermal CVD method, the lattice strain can be introduced into the layer at the same time of the formation of the TiAlCN layer, even with a combination of gas groups different from those described above.

That is, a gas group C of $NH_3$ and $H_2$ and a gas group D of $TiCl_4$, $AlCl_3$, $Al(CH_3)_3$, and $H_2$ are supplied into the reaction apparatus from separate gas supply tubes, the supplying of the gas group C and the gas group D into the reaction apparatus is performed by the same method as the supplying of the gas group A and the gas group B, and the chemical vapor deposition is performed by adjusting the supply amount of each gas component so that $H_2/(AlCl_3+Al(CH_3)_3)$ regarding $H_2$, $AlCl_3$, and $Al(CH_3)_3$ which are gas components becomes a suitable value, to form the TiAlCN layer to which a predetermined lattice strain is introduced.

Reaction gas composition (volume % with respect to all of gas group C and gas group D):

Gas group C: $NH_3$: 2% to 6%, $H_2$: 65% to 75%

Gas group D: $AlCl_3$: 0.3% to 0.9%, $TiCl_4$: 0.1% to 0.2%, $Al(CH_3)_3$: 0.0% to 0.1%, $H_2$: the balance Reaction atmosphere pressure: 4.5 to 5.0 kPa Reaction atmosphere temperature: 700° C. to 900° C.

Supply period: 6 to 9 seconds

Gas supply time per one period: 0.20 to 0.25 seconds

Phase difference in supply between gas group C and gas group D: 0.10 to 0.15 seconds The lattice strain of the TiAlCN layer formed as described above can be measured by the following method, and an index of the lattice strain ΔA can be obtained as follows.

First, the X-ray diffraction is performed regarding the TiAlCN layer, and the X-ray diffraction spectra regarding (111) plane and (200) plane of the TiAlCN crystal grains are obtained.

Then, from the X-ray diffraction spectra measured regarding (111) plane and (200) plane, spacing of lattice plane d(111) and d(200) of (111) plane and (200) plane are calculated by using Bragg's equation: 2d sin θ=nλ (d is spacing of lattice plane, θ is Bragg angle, 2θ is diffraction angle, λ is wavelength of incident X-ray, and n is an integer).

Then, A(111) and A(200) are defined as $$A(111)=3^{1/2}d(111), \text{ and}$$

$$A(200)=2d(200),$$

A(111) and A(200) are obtained from the calculated values of d(111) and d(200).

The index of lattice strain ΔA can be obtained as an absolute value of a difference between A(111) and A(200), that is, $$\Delta A = |A(111)-(A(200)|.$$

In a case where ΔA satisfies 0.007 Å≤ΔA≤0.05 Å, the TiAlCN layer obtains a high hardness, and as a result, excellent wear resistance is exhibited, even in a case where the TiAlCN layer is provided for high-speed intermittent cutting during which high-temperature heat is generated and impact loads are exerted on a cutting edge.

The TiAlCN layer having the index ΔA determined as described above shows a high hardness due to the presence of the lattice strain in the layer, resulting in exhibiting of excellent wear resistance. However, in a case where ΔA is less than 0.007 Å, the lattice strain is small, and thus, the effect of hardness improvement is insufficient. On the other hand, in a case where ΔA is more than 0.05 Å, the lattice strain is excessively great, and thus, fracture resistance during the cutting decreases. Therefore, ΔA is set as 0.007 Å≤ΔA≤0.05 Å.

Crystal Structure:

In the present invention, as described above, it is found that it is possible to increase the hardness of the TiAlCN layer and improve wear resistance, and a coated tool having both excellent characteristics of chipping resistance and wear resistance is obtained, by performing the X-ray diffraction regarding the crystal grains having a NaCl type face-centered cubic structure configuring the TiAlCN layer, and adjusting the absolute value ΔA of a difference between the lattice constants A(111) and A(200) calculated from d(111) and d(200) which are the obtained plane spacing of (111) plane and (200) plane in the predetermined range.

Particularly, in a case where the TiAlCN layer is observed in a longitudinal sectional direction, and a columnar structure in which an average grain width W of each crystal grain having a cubic structure in the layer of complex nitride or complex carbonitride is 0.10 to 2.00 μm, and an average aspect ratio A is 2.0 to 10.0 is provided, the hardness and the toughness of the crystal grains are improved, together with the effects of the TiAlCN layer as the hard coating layer, better characteristics can be exhibited.

That is, by setting the average grain width W as 0.10 μm to 2.00 μm, reactivity with a work material decreases, wear resistance is exhibited, toughness is improved, and chipping resistance can be improved.

Therefore, the average grain width W is more preferably 0.10 to 2.00 μm. In a case where the average aspect ratio A is 2.0 to 10.0 and a sufficient columnar structure is obtained, a small equi-axed crystal is hardly dropped, and sufficient wear resistance can be exhibited, and in a case where the average aspect ratio A is equal to or smaller than 10.0, strength of the crystal grains increase, and thus, the chipping resistance is improved.

Therefore, the average aspect ratio A is more preferably 2.0 to 10.0.

In the present invention, in regards to the average aspect ratio A, in a case where the longitudinal sectional observation of the hard coating layer is performed in a range of a width of 100 μm and a height including all of the hard coating layer, by using a scanning electron microscope, the observation is performed from a sectional side of the coating layer orthogonal to the surface of the tool body, a grain width w in a direction parallel to the surface of the body and a grain length l in a direction perpendicular to the surface of the body are measured, an aspect ratio a (=l/w) of each crystal grain is calculated, an average value of the aspect ratios a obtained regarding individual crystal grains is calculated as the average aspect ratio A, and an average value of the grain widths w obtained regarding individual crystal grains is calculated as the average grain width W.

Lower Layer and Upper Layer:

In the present invention, the TiAlCN layer exhibits sufficient effects as the hard coating layer. However, in a case where a lower layer which includes a Ti compound layer made of one layer or more layers of a Ti carbide layer, a Ti nitride layer, a Ti carbonitride layer, a Ti oxycarbide layer, and a Ti oxycarbonitride layer, and has an average total layer thickness of 0.1 to 20 μm is provided, or in a case where an upper layer including at least an aluminum oxide layer is formed to have an average total layer thickness of 1 to 25 μm, together with the effects of these layers, better characteristics can be exhibited.

In a case where the lower layer including a Ti compound layer made of one or more layers of a Ti carbide layer, a Ti nitride layer, a Ti carbonitride layer, a Ti oxycarbide layer, and a Ti oxycarbonitride layer, and has an average total layer thickness of 0.1 to 20 μm is provided, and the average total layer thickness of the lower layer is less than 0.1 μm, the effect of the lower layer is insufficiently exhibited. On the other hand, in a case where the average total layer thickness thereof is more than 20 μm, the crystal grains easily coarsen and chipping easily occurs. In addition, in a case where the average total layer thickness of the upper layer including an aluminum oxide layer is less than 1 μm, the effect of the upper layer is insufficiently exhibited. On the other hand, in a case where the average total layer thickness thereof is more than 25 μm, the crystal grains easily coarsen and chipping easily occurs.

Advantageous Effects of Invention

In the present invention, in the surface-coated cutting tool in which the hard coating layer is provided on the surface of the tool body, the TiAlCN layer having an average layer thickness of 1 to 20 μm is at least included as the hard coating layer, in a case where the TiAlCN layer is expressed by the composition formula: $(Ti_{1-X}Al_X)(C_YN_{1-Y})$, an average content ratio X of Al and an average content ratio Y of C (both X and Y are atomic ratios) respectively satisfy 0.60≤X≤0.95 and 0≤Y≤0.005, the X-ray diffraction is performed regarding the cubic crystal grain of the TiAlCN layer, the plane spacings d(111) and d(200) of (111) plane and (200) plane are calculated, A(111) and A(200) are calculated, the absolute value ΔA of a difference between A(111) and A(200), ΔA=|A(111)−(A(200)| is obtained, and in this case, 0.007 Å≤ΔA≤0.05 Å is satisfied.

Therefore, in the coated tool of the present invention, the TiAlCN layer has suitable lattice strain (0.007 Å≤ΔA≤0.05 Å), and an increase in hardness is achieved. Therefore, the TiAlCN layer has excellent chipping resistance and excellent wear resistance during long-term use, in a case where the coated tool is provided for high-speed intermittent cutting of alloy steel or the like during which high-temperature heat is generated and impact loads are exerted on a cutting edge.

DETAILED DESCRIPTION OF THE INVENTION

Next, Examples of the coated tool of the present invention will be described in more detail.

In the following examples, a case where tungsten carbide-based cemented carbide (hereinafter, referred to as WC-based cemented carbide) or titanium carbonitride-based cermet (hereinafter, referred to as TiCN-based cermet) is used will be described, and the same applies to a case where a cubic boron nitride-based ultra-high-pressure sintered body is used as a tool body.

Example 1

As raw material powders, a WC powder, a TiC powder, a TaC powder, an NbC powder, a $Cr_3C_2$ powder, and a Co powder, all of which had an average grain size of 1 to 3 μm, were prepared, and the raw material powders were mixed in blending compositions shown in Table 1. Wax was further added thereto, and the mixture was blended in acetone by a ball mill for 24 hours and was dried under reduced pressure. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, tool bodies A to C made of WC-based cemented carbide with insert shapes according to ISO standard SEEN1203AFSN were produced.

In addition, as raw material powders, a TiCN (TiC/TiN=50/50 in terms of mass ratio) powder, an $Mo_2C$ powder, a ZrC powder, an NbC powder, a WC powder, a Co powder, and an Ni powder, all of which had an average grain size of 0.5 to 2 μm, were prepared, and the raw material powders were mixed in blending compositions shown in Table 2, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a tool body D made of TiCN-based cermet with insert shapes according to ISO standard SEEN1203AFSN was produced.

Next, a TiAlCN layer was formed on surfaces of the tool bodies A to D by chemical vapor deposition using a chemical vapor deposition apparatus.

The chemical vapor deposition conditions are as follows.

A thermal CVD method was performed for a predetermined time under forming conditions A to J shown in Tables 4 and 5, in which a gas group A of $NH_3$ and $H_2$ and a gas group B of $TiCl_4$, $AlCl_3$, $N_2$, $Al(CH_3)_3$, and $H_2$ were used and in each gas supply method, a reaction gas composition (volume % with respect to the total amount of the gas group A and the gas group B) included a gas group A of $NH_3$: 2% to 6%, $H_2$: 65% to 75% and a gas group B of $AlCl_3$: 0.5% to 0.9%, $TiCl_4$: 0.2% to 0.3%, $N_2$: 3.0% to 12.0%, $Al(CH_3)_3$: 0.0% to 0.1%, $H_2$: the balance, a reaction atmosphere pressure was 4.5 to 5.0 kPa, a reaction atmosphere temperature was 700° C. to 900° C., a supply period was 6 to 9 seconds, a gas supply time per one period was 0.15 to 0.25 seconds, a phase difference in supply between gas group A and gas group B was 0.10 to 0.20 seconds, and a supply ratio $N_2/(AlCl_3+Al(CH_3)_3)$ of $N_2$, $AlCl_3$, and $Al(CH_3)_3$ was 3 to 24.

In addition, a thermal CVD method was performed for a predetermined time under forming conditions K to L shown in Tables 6 and 7, in which a gas group C of $NH_3$ and $H_2$ and a gas group D of $TiCl_4$, $AlCl_3$, $Al(CH_3)_3$, and $H_2$ were used and in each gas supply method, a reaction gas composition (volume % with respect to the total amount of the gas group C and the gas group D) included a gas group C of $NH_3$: 2% to 6%, $H_2$: 65% to 75% and a gas group D of $AlCl_3$: 0.3% to 0.9%, $TiCl_4$: 0.1% to 0.2%, $Al(CH_3)_3$: 0.0% to 0.1%, $H_2$: the balance, a reaction atmosphere pressure was 4.5 to 5.0 kPa, a reaction atmosphere temperature was 700° C. to 900° C., a supply period was 6 to 9 seconds, a gas supply time per one period was 0.20 to 0.25 seconds, a phase difference in supply between gas group C and gas group D was 0.10 to 0.15 seconds, and a supply ratio $H_2/(AlCl_3+Al(CH_3)_3)$ of $H_2$, $AlCl_3$, and $Al(CH_3)_3$ was 100 to 160.

Coated tool of the present inventions 1 to 17 having average target layer thicknesses, average compositions X of Al, and average compositions Y of C shown in Table 9 were produced by forming TiAlCN layers under the conditions of Tables 4, 5, 6, and 7.

In addition, a lower layer and/or an upper layer shown in Table 8 were formed on the coated tool of the present inventions 6 to 13 and 17 under forming conditions shown in Table 3.

In addition, for the purpose of comparison, hard coating layers including at least a TiAlCN layer were deposited on the surfaces of the tool bodies A to D to have an average target layer thickness (μm) shown in Table 10 by chemical vapor deposition under forming conditions A' to J' shown in Tables 4 and 5 and forming conditions K' to L' shown in Tables 6 and 7.

In addition, in the same manner as in the coated tool of the present inventions 6 to 13 and 17, a lower layer and an upper layer shown in Table 8 were formed on the coated tool of Comparative Examples 6 to 13 and 17 under forming conditions shown in Table 3.

The section of each of constituent layers of the coated tool of the present inventions 1 to 17, and the coated tool of Comparative Examples 1 to 17, in a direction perpendicular to the tool body was measured using a scanning electron microscope (at a magnification of 5000×). An average layer thickness was obtained by measuring and averaging the layer thicknesses of five points in a field of view. All of the results showed substantially the same average layer thicknesses as the target layer thicknesses shown in Tables 9 and 10.

In addition, regarding the average content ratio X of Al and the average content ratio Z of Cl of the TiAlCN layer, a sample of which the surface was polished using an electron probe micro-analyzer (EPMA) was irradiated with electron beams from the sample surface side, and the average content ratio X of Al and the average content ratio Z of Cl were obtained by averaging 10 points of the analytic result of obtained characteristic X-rays.

The average content ratio Y of C was obtained by secondary ion mass spectrometry (SIMS). Ion beams were emitted toward a range of 70 μm×70 μm from the sample surface side, and the concentration of components emitted by a sputtering action was measured in a depth direction. The average content ratio Y of C represents the average value in the depth direction of the TiAlCN layer.

However, the content ratio of C excludes an unavoidable content ratio of C which is included even though gas containing C is not intentionally used as a gas raw material. Specifically, the content ratio (atomic ratio) of C contained in the TiAlCN layer in a case where the amount of supplied Al(CH$_3$)$_3$ was set to 0 was obtained as the unavoidable content ratio of C, and a value obtained by subtracting the unavoidable content ratio of C from the content ratio (atomic ratio) of C contained in the TiAlCN layer obtained in a case where Al(CH$_3$)$_3$ was intentionally supplied is set to Y.

Tables 9 and 10 shows values of X, Y, and Z obtained as described above (X, Y, and Z are all atomic ratios).

The X-ray diffraction was performed in a direction perpendicular to the longitudinal section of the TiAlCN layer, and lattice plane spacing d(111) and d(200) were calculated from the X-ray diffraction spectra of the (111) plane and (200) plane of the crystal grains having a cubic structure, based on Bragg's equation: $2d \sin \theta = n\lambda$.

Then, from d(111) and d(200), A(111) and A(200) corresponding to the lattice constants were calculated from the following equations.

$$A(111) = 3^{1/2} d(111)$$

$$A(200) = 2 d(200)$$

Then, an absolute value of a difference between A(111) and A(200) was obtained as the index of the lattice strain ΔA.

Tables 9 and 10 shows values of d(111), d(200), A(111), A(200), and ΔA obtained as described above.

The measurement in the X-ray diffraction was performed under conditions of measurement conditions; Cu-Kα ray (λ=1.5418 Å) was used as a radiation source, a measurement range (2θ) was 30 to 50 degrees, a scan step was 0.013 degrees, and measurement time per one step was 0.48 sec/step.

TABLE 1

| Type | | Blending composition (mass %) | | | | |
|---|---|---|---|---|---|---|
| | | Co | TiC | TaC | NbC | Cr$_3$C$_2$ | WC |
| Tool body | A | 8.0 | 1.5 | — | 3.0 | 0.4 | Balance |
| | B | 8.5 | — | 1.8 | 0.2 | — | Balance |
| | C | 7.0 | — | — | — | — | Balance |

TABLE 2

| Type | | Blending composition (mass %) | | | | | |
|---|---|---|---|---|---|---|---|
| | | Co | Ni | ZrC | NbC | Mo$_2$C | WC | TiCN |
| Tool body | D | 8 | 5 | 1 | 6 | 6 | 10 | Balance |

TABLE 3

Constituent layers of hard coating layer Forming conditions (pressure of reaction atmosphere indicates kPa and temperature indicates ° C.)

| | | Formation | | Reaction atmosphere | |
|---|---|---|---|---|---|
| Type | | symbol | Reaction gas composition (volume %) | Pressure | Temperature |
| TiAlCN layer | TiAlCN | TiAlCN | See Table 4 or 6 | See Table 5 or 7 | See Table 5 or 7 |
| Ti compound layer | TiC | TiC | TiCl$_4$: 2%, CH$_4$: 10%, H$_2$: balance | 7 | 850 |
| | TiN | TiN | TiCl$_4$: 4.2%, N$_2$: 30%, H$_2$: balance | 7 | 800 |
| | TiCN | TiCN | TiCl$_4$: 2%, CH$_3$CN: 0.7%, N$_2$: 10%, H$_2$: balance | 7 | 800 |
| | TiCO | TiCO | TiCl$_4$: 4.2%, CO: 4%, H$_2$: balance | 7 | 900 |
| | TiCNO | TiCNO | TiCl$_4$: 2%, CH$_3$CN: 0.7%, CO: 1%, N$_2$: 10%, H$_2$: balance | 7 | 800 |
| Al$_2$O$_3$ layer | Al$_2$O$_3$ | Al$_2$O$_3$ | AlCl$_3$: 2.2%, CO$_2$: 5.5%, HCl: 2.2%, H$_2$S: 0.2%, H$_2$: balance | 7 | 900 |

TABLE 4

Reaction conditions (reaction gas composition indicates ratio in total amount of gas group A and gas group B)

| Formation of TiAlCN layer | | Reaction gas group A composition | | Reaction gas group B composition (volume %) | | | | | |
|---|---|---|---|---|---|---|---|---|---|
| Process type | Formation symbol | NH$_3$ | H$_2$ | AlCl$_3$ | TiCl$_4$ | N$_2$ | Al(CH$_3$)$_3$ | H$_2$ | N$_2$/(AlCl$_3$ + Al(CH$_3$)$_3$) |
| Film forming process in the present invention | A | 3.6 | 72 | 0.68 | 0.23 | 6.0 | 0.00 | Balance | 8.8 |
| | B | 2.4 | 70 | 0.50 | 0.30 | 3.0 | 0.06 | Balance | 5.4 |
| | C | 6.0 | 65 | 0.87 | 0.20 | 12.0 | 0.00 | Balance | 13.8 |
| | D | 3.9 | 68 | 0.68 | 0.29 | 7.0 | 0.06 | Balance | 9.5 |
| | E | 2.9 | 65 | 0.90 | 0.26 | 3.0 | 0.10 | Balance | 3.0 |
| | F | 5.6 | 73 | 0.88 | 0.23 | 11.5 | 0.00 | Balance | 13.1 |
| | G | 5.2 | 70 | 0.50 | 0.20 | 12.0 | 0.00 | Balance | 24.0 |
| | H | 4.3 | 75 | 0.58 | 0.27 | 8.0 | 0.02 | Balance | 13.3 |
| | I | 2.0 | 65 | 0.57 | 0.20 | 3.0 | 0.06 | Balance | 4.8 |
| | J | 4.1 | 69 | 0.65 | 0.27 | 7.5 | 0.00 | Balance | 11.5 |

TABLE 4-continued

Reaction conditions (reaction gas composition indicates ratio in total amount of gas group A and gas group B)

| Process type | Formation of TiAlCN layer Formation symbol | Reaction gas group A composition (volume %) | | Reaction gas group B composition (volume %) | | | | | |
|---|---|---|---|---|---|---|---|---|---|
| | | $NH_3$ | $H_2$ | $AlCl_3$ | $TiCl_4$ | $N_2$ | $Al(CH_3)_3$ | $H_2$ | $N_2/(AlCl_3 + Al(CH_3)_3)$ |
| Film forming process in Comparative Example | A' | 2.8 | 68 | 1.15 | 0.23 | 0.5 | 0.00 | Balance | 0.4 |
| | B' | 2.1 | 70 | 0.40 | 0.30 | 1.5 | 0.00 | Balance | 3.8 |
| | C' | 5.1 | 70 | 0.82 | 0.20 | 18.0 | 1.60 | Balance | 7.4 |
| | D' | 0.3 | 68 | 0.22 | 0.10 | 0.0 | 0.10 | Balance | 0.0 |
| | E' | 0.6 | 60 | 0.86 | 0.26 | 0.0 | 0.00 | Balance | 0.0 |
| | F' | 10.1 | 40 | 0.78 | 0.23 | 22.0 | 0.00 | Balance | 28.2 |
| | G' | 8.8 | 20 | 0.55 | 0.19 | 50.0 | 1.60 | Balance | 23.3 |
| | H' | 1.3 | 80 | 0.41 | 0.23 | 0.1 | 0.00 | Balance | 0.2 |
| | I' | 2.2 | 50 | 0.29 | 0.25 | 2.2 | 0.00 | Balance | 7.6 |
| | J' | 11.0 | 40 | 1.3 | 0.27 | 35.0 | 0.20 | Balance | 23.3 |

TABLE 5

Reaction conditions (pressure of reaction atmosphere indicates kPa and temperature indicates ° C.)

| Process type | Formation of TiAlCN layer Formation symbol | Gas group A Supply period (sec) | Gas group A Supply time per one period (sec) | Gas group B Supply period (sec) | Gas group B Supply time per one period (sec) | Phase difference in supply between gas group A and gas group B (sec) | Reaction atmosphere Pressure | Reaction atmosphere Temperature |
|---|---|---|---|---|---|---|---|---|
| Film forming process in the present invention | A | 7.7 | 0.16 | 7.7 | 0.25 | 0.14 | 4.5 | 800 |
| | B | 6.0 | 0.16 | 6.0 | 0.21 | 0.16 | 4.7 | 700 |
| | C | 6.9 | 0.21 | 6.9 | 0.23 | 0.12 | 4.9 | 750 |
| | D | 9.0 | 0.17 | 9.0 | 0.17 | 0.10 | 4.8 | 700 |
| | E | 7.4 | 0.20 | 7.4 | 0.16 | 0.15 | 4.8 | 800 |
| | F | 7.3 | 0.21 | 7.3 | 0.24 | 0.20 | 5.0 | 850 |
| | G | 8.0 | 0.15 | 8.0 | 0.22 | 0.11 | 4.6 | 800 |
| | H | 7.1 | 0.16 | 7.1 | 0.25 | 0.12 | 4.8 | 900 |
| | I | 8.5 | 0.24 | 8.5 | 0.23 | 0.18 | 4.6 | 750 |
| | J | 6.7 | 0.25 | 6.7 | 0.16 | 0.17 | 4.7 | 850 |
| Film forming process in Comparative Example | A' | 7.7 | 0.16 | 7.7 | 0.25 | 0.14 | 4.8 | 950 |
| | B' | 7.1 | 0.16 | 7.1 | 0.21 | 0.16 | 4.7 | 700 |
| | C' | 6.5 | 0.18 | 6.5 | 0.24 | 0.17 | 4.6 | 750 |
| | D' | 15.0 | 0.20 | 15.0 | 0.16 | 0.20 | 4.5 | 800 |
| | E' | 7.0 | 0.18 | 7.0 | 0.16 | 0.15 | 4.8 | 800 |
| | F' | 6.0 | 0.18 | 6.0 | 0.16 | 0.16 | 4.5 | 850 |
| | G' | 7.0 | 0.17 | 7.0 | 0.23 | 0.10 | 4.6 | 850 |
| | H' | 7.1 | 0.21 | 7.1 | 0.26 | 0.15 | 5.0 | 800 |
| | I' | 5.0 | 0.25 | 5.0 | 0.17 | 0.30 | 5.5 | 750 |
| | J' | 6.8 | 0.30 | 6.8 | 0.18 | 0.20 | 4.5 | 700 |

TABLE 6

Reaction conditions (reaction gas composition indicates ratio in total amount of gas group C and gas group D)

| Process type | Formation of TiAlCN layer Formation symbol | Reaction gas group C composition (volume %) NH$_3$ | H$_2$ | Reaction gas group D composition (volume %) AlCl$_3$ | TiCl$_4$ | Al(CH$_3$)$_3$ | H$_2$ | H$_2$/ (AlCl$_3$ + Al(CH$_3$)$_3$) |
|---|---|---|---|---|---|---|---|---|
| Film forming process in the present invention | K | 6.0 | 70 | 0.5 | 0.2 | 0.10 | Balance | 155 |
|  | L | 2.0 | 70 | 0.9 | 0.2 | 0.00 | Balance | 108 |
| Film forming process in Comparative Example | K' | 4.0 | 85 | 1.2 | 0.10 | 0.00 | Balance | 78 |
|  | L' | 3.0 | 40 | 0.4 | 0.1 | 0.05 | Balance | 386 |

TABLE 7

Reaction conditions (pressure of reaction atmosphere indicates kPa and temperature indicates °C.)

| Process type | Formation of TiAlCN layer Formation symbol | Gas group C Supply period (sec) | Gas group C Supply time per one period (sec) | Gas group D Supply period (sec) | Gas group D Supply time per one period (sec) | Phase difference in supply between gas group C and gas group D (sec) | Reaction atmosphere Pressure | Reaction atmosphere Temperature |
|---|---|---|---|---|---|---|---|---|
| Film forming process in the present invention | K | 7.0 | 0.23 | 7.0 | 0.23 | 0.10 | 4.8 | 750 |
|  | L | 7.2 | 0.20 | 7.2 | 0.20 | 0.15 | 4.6 | 800 |
| Film forming process in Comparative Example | K' | 6.2 | 0.13 | 6.2 | 0.13 | 0.10 | 5.0 | 950 |
|  | L' | 5.5 | 0.20 | 5.5 | 0.20 | 0.12 | 4.5 | 700 |

TABLE 8

Hard coating layer (numerical value at the bottom indicates target average layer thickness (μm) of layer)

| Type | Tool body symbol | Lower layer First layer | Lower layer Second layer | Lower layer Third layer | Upper layer First layer | Upper layer Second layer |
|---|---|---|---|---|---|---|
| Coated tool of the present invention, Coated tool of Comparative Example | 1 A | — | — | — | — | — |
|  | 2 B | — | — | — | — | — |
|  | 3 C | — | — | — | — | — |
|  | 4 D | — | — | — | — | — |
|  | 5 A | — | — | — | — | — |
|  | 6 B | TiC (0.1) | — | — | — | — |
|  | 7 C | TiN (0.5) | — | — | — | — |
|  | 8 D | TiN (1) | TiCN (3) | — | — | — |
|  | 9 A | TiN (0.2) | TiCN (2.5) | TiCNO (0.2) | — | — |
|  | 10 B | — | — | — | Al$_2$O$_3$ (1) | — |
|  | 11 C | TiC (0.5) | — | — | TiCN (0.5) | Al$_2$O$_3$ (3) |
|  | 12 A | TiC (1) | — | — | TiCO (1) | Al$_2$O$_3$ (2) |
|  | 13 A | TiN (0.1) | — | — | TiCNO (0.3) | Al$_2$O$_3$ (1) |
|  | 14 B | — | — | — | — | — |
|  | 15 C | — | — | — | — | — |
|  | 16 A | — | — | — | — | — |

TABLE 8-continued

| Type | Tool body symbol | Hard coating layer (numerical value at the bottom indicates target average layer thickness (μm) of layer) | | | | |
|---|---|---|---|---|---|---|
| | | Lower layer | | | Upper layer | |
| | | First layer | Second layer | Third layer | First layer | Second layer |
| 17 | B | TiN (0.5) | — | — | TiCN (0.5) | $Al_2O_3$ (3) |

TABLE 9

| | | | Hard coating layer TiAl complex carbonitride (TiAlCN layer) | | | |
|---|---|---|---|---|---|---|
| Type | | Tool body symbol | TiAlCN film forming process formation symbol (see Tables 4 and 5 or Tables 6 and 7) | Average content ratio X of Al (atomic ratio) | Average content ratio Y of C (atomic ratio) | Average content ratio Z of Cl (atomic ratio) |
| Coated tool of the present invention | 1 | A | A | 0.81 | 0 | 0.0016 |
| | 2 | B | B | 0.60 | 0.003 | 0.0026 |
| | 3 | C | C | 0.94 | 0 | 0.0032 |
| | 4 | D | D | 0.75 | 0.003 | 0.0040 |
| | 5 | A | E | 0.90 | 0.005 | 0.0025 |
| | 6 | B | F | 0.90 | 0 | 0.0012 |
| | 7 | C | G | 0.74 | 0 | 0.0007 |
| | 8 | D | H | 0.68 | 0.001 | 0.0001 |
| | 9 | A | I | 0.83 | 0.003 | 0.0017 |
| | 10 | B | J | 0.73 | 0 | 0.0004 |
| | 11 | C | A | 0.79 | 0 | 0.0014 |
| | 12 | A | B | 0.62 | 0.003 | 0.0028 |
| | 13 | A | C | 0.94 | 0 | 0.0033 |
| | 14 | B | D | 0.76 | 0.003 | 0.0039 |
| | 15 | C | E | 0.89 | 0.005 | 0.0026 |
| | 16 | A | K | 0.82 | 0 | 0.0015 |
| | 17 | B | L | 0.89 | 0.005 | 0.0025 |

| | | Hard coating layer TiAl complex carbonitride (TiAlCN layer) | | | | | | |
|---|---|---|---|---|---|---|---|---|
| Type | | X-ray diffraction | | | | | Grain width W (μm) | Aspect ratio A | Target average layer thickness (μm) |
| | | d (111) | d (200) | A (111) | A (200) | ΔA (Å) | | | |
| Coated tool of the present invention | 1 | 2.349 | 2.047 | 4.069 | 4.094 | 0.025 | 1.22 | 3.7 | 5.5 |
| | 2 | 2.378 | 2.053 | 4.119 | 4.105 | 0.014 | 0.09 | 22.0 | 2.5 |
| | 3 | 2.328 | 2.037 | 4.033 | 4.073 | 0.040 | 2.00 | 1.7 | 4.0 |
| | 4 | 2.350 | 2.049 | 4.070 | 4.098 | 0.028 | 0.11 | 4.0 | 6.7 |
| | 5 | 2.346 | 2.035 | 4.063 | 4.070 | 0.007 | 1.10 | 3.5 | 7.0 |
| | 6 | 2.340 | 2.044 | 4.054 | 4.088 | 0.034 | 0.88 | 2.2 | 4.0 |
| | 7 | 2.349 | 2.059 | 4.068 | 4.118 | 0.050 | 0.23 | 12.0 | 5.3 |
| | 8 | 2.386 | 2.050 | 4.133 | 4.101 | 0.032 | 0.65 | 6.2 | 6.2 |
| | 9 | 2.348 | 2.038 | 4.066 | 4.076 | 0.010 | 0.53 | 2.0 | 1.0 |
| | 10 | 2.360 | 2.059 | 4.087 | 4.117 | 0.030 | 1.03 | 2.1 | 3.0 |
| | 11 | 2.350 | 2.049 | 4.070 | 4.097 | 0.027 | 0.82 | 2.0 | 2.0 |
| | 12 | 2.376 | 2.050 | 4.115 | 4.100 | 0.015 | 0.69 | 3.6 | 3.0 |
| | 13 | 2.328 | 2.036 | 4.033 | 4.073 | 0.040 | 0.50 | 3.0 | 2.0 |
| | 14 | 2.349 | 2.048 | 4.068 | 4.096 | 0.028 | 2.12 | 1.5 | 3.0 |
| | 15 | 2.350 | 2.039 | 4.070 | 4.078 | 0.008 | 2.43 | 1.6 | 6.0 |
| | 16 | 2.348 | 2.058 | 4.067 | 4.116 | 0.049 | 0.74 | 2.0 | 3.0 |
| | 17 | 2.346 | 2.050 | 4.063 | 4.100 | 0.037 | 0.91 | 2.2 | 4.0 |

TABLE 10

| Type | | Tool body symbol | TiAlCN film forming process formation symbol (see Tables 4 and 5 or Tables 6 and 7) | Average content ratio X of Al (atomic ratio) | Average content ratio Y of C (atomic ratio) | Average content ratio Z of Cl (atomic ratio) |
|---|---|---|---|---|---|---|
| Coated tool of Comparative Example | 1 | A | A' | 0.98* | 0 | 0.0075* |
| | 2 | B | B' | 0.50* | 0 | 0.0021 |
| | 3 | C | C' | 0.92 | 0.008* | 0.0035 |
| | 4 | D | D' | 0.70 | 0.005 | 0.00009* |
| | 5 | A | E' | 0.85 | 0 | 0.0024 |
| | 6 | B | F' | 0.86 | 0 | 0.0014 |
| | 7 | C | G' | 0.81 | 0.008* | 0.0006 |
| | 8 | D | H' | 0.60 | 0 | 0.0008 |
| | 9 | A | I' | 0.40* | 0 | 0.0055* |
| | 10 | B | J' | 0.97* | 0.010* | 0.0045* |
| | 11 | C | A' | 0.97* | 0 | 0.008* |
| | 12 | A | B' | 0.48* | 0 | 0.0023 |
| | 13 | A | C' | 0.94 | 0.008* | 0.0035 |
| | 14 | B | D' | 0.73 | 0.005 | 0.0001 |
| | 15 | C | E' | 0.86 | 0 | 0.0026 |
| | 16 | A | K' | 0.96* | 0 | 0.0030 |
| | 17 | B | L' | 0.86 | 0.003 | 0.0010 |

| Type | | X-ray diffraction | | | | | Grain width W (μm) | Aspect ratio A | Target average layer thickness (μm) |
|---|---|---|---|---|---|---|---|---|---|
| | | d (111) | d (200) | A (111) | A (200) | ΔA (Å) | | | |
| Coated tool of Comparative Example | 1 | — | — | — | — | — | — | — | 4.0 |
| | 2 | 2.389 | 2.062 | 4.137 | 4.123 | 0.014 | 0.32 | 7.2 | 2.5 |
| | 3 | 2.330 | 2.038 | 4.036 | 4.076 | 0.04 | 0.68 | 5.1 | 5.0 |
| | 4 | 2.365 | 2.049 | 4.097 | 4.098 | 0.001* | 0.08 | 20.0 | 6.7 |
| | 5 | 2.353 | 2.038 | 4.076 | 4.076 | 0* | 1.12 | 0.5 | 2.0 |
| | 6 | 2.335 | 2.055 | 4.045 | 4.110 | 0.065* | 0.91 | 2.5 | 3.5 |
| | 7 | 2.336 | 2.063 | 4.045 | 4.125 | 0.08* | 0.30 | 15.0 | 5.0 |
| | 8 | 2.380 | 2.059 | 4.123 | 4.118 | 0.005* | 0.38 | 8.1 | 4.5 |
| | 9 | 2.405 | 2.071 | 4.166 | 4.141 | 0.025 | 0.10 | 8.4 | 1.0 |
| | 10 | 2.322 | 2.036 | 4.022 | 4.072 | 0.05 | 1.20 | 2.4 | 3.0 |
| | 11 | — | — | — | — | — | — | — | 2.0 |
| | 12 | 2.389 | 2.061 | 4.138 | 4.123 | 0.015 | 0.32 | 6.5 | 3.0 |
| | 13 | 2.330 | 2.038 | 4.036 | 4.076 | 0.04 | 0.65 | 3.0 | 2.0 |
| | 14 | 2.365 | 2.049 | 4.097 | 4.098 | 0.002* | 0.09 | 15.0 | 3.0 |
| | 15 | 2.353 | 2.038 | 4.076 | 4.076 | 0* | 1.20 | 4.0 | 6.0 |
| | 16 | — | — | — | — | — | — | — | 3.0 |
| | 17 | 2.353 | 2.036 | 4.076 | 4.072 | 0.004* | 0.13 | 8.3 | 2.1 |

(Note 1)
Mark *in boxes indicates a range beyond the range of the present invention.
(Note 2)
Mark - in boxes indicates that measurement cannot be performed because cubic crystal was not observed.

Next, in a state in which each of the various coated tools was clamped to a cutter tip end portion made of tool steel with a cutter diameter of 125 mm by a fixing tool, the coated tool of the present inventions 1 to 17 and the coated tool of Comparative Examples 1 to 17, were subjected to dry high-speed face milling, which is a type of high-speed intermittent cutting of alloy steel, and a center-cut cutting test, which are described below, and the flank wear width of a cutting edge was measured.

Tool body: tungsten carbide-based cemented carbide, titanium carbonitride-based cermet
Cutting test: dry high-speed face milling, center-cut cutting
Work material: a block material of JIS SCM440 with a width of 100 mm and a length of 400 mm
Rotational speed: 994 min$^{-1}$
Cutting speed: 390 m/min
Depth of cut: 1.8 mm,
Feed per tooth: 0.20 mm/tooth
Cutting time: 8 minutes
Results thereof are shown in Table 11.

TABLE 11

| Type | | Flank wear width (mm) | Type | | Cutting test results (min) |
|---|---|---|---|---|---|
| Coated tool of the present invention | 1 | 0.16 | Coated tool of Comparative Example | 1 | 2.0* |
| | 2 | 0.16 | | 2 | 2.4* |
| | 3 | 0.17 | | 3 | 3.3* |
| | 4 | 0.14 | | 4 | 4.3* |
| | 5 | 0.15 | | 5 | 4.0* |

TABLE 11-continued

| Type | | Flank wear width (mm) | Type | | Cutting test results (min) |
|---|---|---|---|---|---|
| | 6 | 0.14 | | 6 | 3.4* |
| | 7 | 0.14 | | 7 | 3.1* |
| | 8 | 0.12 | | 8 | 5.3* |
| | 9 | 0.11 | | 9 | 4.7* |
| | 10 | 0.10 | | 10 | 3.0* |
| | 11 | 0.08 | | 11 | 2.2* |
| | 12 | 0.09 | | 12 | 2.7* |
| | 13 | 0.10 | | 13 | 6.1* |
| | 14 | 0.18 | | 14 | 6.5* |
| | 15 | 0.16 | | 15 | 4.0* |
| | 16 | 0.13 | | 16 | 2.0* |
| | 17 | 0.09 | | 17 | 4.5* |

Mark * in boxes of coated tool of Comparative Examples indicates a cutting time (min) until the end of a service life caused by the occurrence of chipping.

Example 2

As raw material powders, a WC powder, a TiC powder, a ZrC powder, a TaC powder, an NbC powder, a $Cr_3C_2$ powder, a TiN powder, and a Co powder, all of which had an average grain size of 1 to 3 μm, were prepared, and the raw material powders were mixed in blending compositions shown in Table 12. Wax was further added thereto, and the mixture was blended in acetone by a ball mill for 24 hours and was dried under reduced pressure. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, a cutting edge portion was subjected to honing to have a radius R of 0.07 mm, thereby forming tool bodies α to γ made of WC-based cemented carbide with insert shapes according to ISO standard CNMG120412.

TABLE 12

| | | Blending composition (mass %) | | | | | | |
|---|---|---|---|---|---|---|---|---|
| Type | | Co | TiC | ZrC | TaC | NbC | $Cr_3C_2$ | TiN | WC |
| Tool body | α | 7.0 | — | 1.5 | — | 2.7 | 0.2 | 1.0 | Balance |
| | β | 6.0 | 2.1 | — | 3.5 | 0.5 | — | 1.0 | Balance |
| | γ | 6.5 | — | — | — | — | — | — | Balance |

In addition, as raw material powders, a TiCN (TiC/TiN=50/50 in terms of mass ratio) powder, an NbC powder, a WC powder, a Co powder, and an Ni powder, all of which had an average grain size of 0.5 to 2 μm, were prepared, and the raw material powders were mixed in blending compositions shown in Table 13, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa under the condition that the green compacts were held at a temperature of 1500° C. for one hour. After the sintering, a cutting edge portion was subjected to honing to have a radius R of 0.09 mm, thereby forming a tool body δ made of TiCN-based cermet with an insert shape according to ISO standard CNMG120412.

TABLE 13

| | | Blending composition (mass %) | | | | |
|---|---|---|---|---|---|---|
| Type | | Co | Ni | NbC | WC | TiCN |
| Tool body | δ | 12 | 3 | 7 | 15 | Balance |

Subsequently, a thermal CVD method was performed on surfaces of these tool bodies α to γ and the tool body δ for a predetermined time by using a typical chemical vapor deposition apparatus, under forming conditions A to J shown in Tables 4 and 5, in which a gas group A of $NH_3$ and $H_2$ and a gas group B of $AlCl_3$, $TiCl_4$, $N_2$, $Al(CH_3)_3$, and $H_2$ were used and in each gas supply method, a reaction gas composition (volume % with respect to the total amount of the gas group A and the gas group B) included a gas group A of $NH_3$: 2% to 6%, $H_2$: 65% to 75% and a gas group B of $AlCl_3$: 0.5% to 0.9%, $TiCl_4$: 0.2% to 0.3%, $N_2$: 3.0% to 12.0%, $Al(CH_3)_3$: 0.0% to 0.1%, $H_2$: the balance, a reaction atmosphere pressure was 4.5 to 5.0 kPa, a reaction atmosphere temperature was 700° C. to 900° C., a supply period was 6 to 9 seconds, a gas supply time per one period was 0.15 to 0.25 seconds, a phase difference in supply between gas group A and gas group B was 0.10 to 0.20 seconds, and a supply ratio $N_2/(AlCl_3+Al(CH_3)_3)$ of $N_2$, $AlCl_3$, and $Al(CH_3)_3$ was 3 to 24.

In addition, a thermal CVD method was performed for a predetermined time under forming conditions K to L shown in Tables 6 and 7, in which a gas group C of $NH_3$ and $H_2$ and a gas group D of $TiCl_4$, $AlCl_3$, $Al(CH_3)_3$, and $H_2$ were used and in each gas supply method, a reaction gas composition (volume % with respect to the total amount of the gas group C and the gas group D) included a gas group C of $NH_3$: 2% to 6%, $H_2$: 65% to 75% and a gas group D of $AlCl_3$: 0.3% to 0.9%, $TiCl_4$: 0.1% to 0.2%, $Al(CH_3)_3$: 0.0% to 0.1%, $H_2$: the balance, a reaction atmosphere pressure was 4.5 to 5.0 kPa, a reaction atmosphere temperature was 700° C. to 900° C., a supply period was 6 to 9 seconds, a gas supply time per one period was 0.20 to 0.25 seconds, a phase difference in supply between gas group C and gas group D was 0.10 to 0.15 seconds, and a supply ratio $H_2/(AlCl_3+Al(CH_3)_3)$ of $H_2$, $AlCl_3$, and $Al(CH_3)_3$ was 100 to 160.

Coated tool of the present inventions 18 to 34 having average target layer thicknesses, average compositions X of Al, and average compositions Y of C shown in Table 15 were produced by forming TiAlCN layers under the conditions of Tables 4, 5, 6, and 7.

In addition, a lower layer and an upper layer shown in Table 14 were formed on the coated tool of the present inventions 23 to 30 and 34 under forming conditions shown in Table 3.

In addition, for the purpose of comparison, in the same manner as in the coated tool of the present inventions, coated tool of Comparative Examples 18 to 34 shown in Table 14 were produced by depositing hard coating layers on the surfaces of the same tool bodies α to γ and the tool body δ to have target layer thicknesses shown in Table 14 under the conditions shown in Tables 4 and 5 using a typical chemical vapor deposition apparatus.

In addition, in the same manner as in the coated tool of the present inventions 23 to 30 and 34, a lower layer and an upper layer shown in Table 14 were formed on the coated tool of Comparative Examples 23 to 30 and 34 under the forming conditions shown in Table 3.

The section of each of constituent layers of the coated tool of the present inventions 18 to 34 and the coated tool of Comparative Examples 18 to 34 was measured using a scanning electron microscope (at a magnification of 5000×). An average layer thickness was obtained by measuring and averaging the layer thicknesses of five points in a field of view. All of the results showed substantially the same average layer thicknesses as the target layer thicknesses shown in Tables 15 and 16.

Regarding the TiAlCN layer of the coated tool of the present inventions 18 to 34 and the coated tool of Comparative Examples 18 to 34, X, Y, Z, d(111), d(200), A(111), A(200), and ΔA were obtained by using the same methods as methods shown in Table 1.

Results thereof are shown in Tables 15 and 16.

TABLE 14

| Type | Tool body symbol | Hard coating layer (numerical value at the bottom indicates target average layer thickness (μm) of layer) | | | | |
|---|---|---|---|---|---|---|
| | | Lower layer | | | Upper layer | |
| | | First layer | Second layer | Third layer | First layer | Second layer |
| Coated tool of the present invention, | 18 α | — | — | — | — | — |
| | 19 β | — | — | — | — | — |
| | 20 γ | — | — | — | — | — |
| | 21 δ | — | — | — | — | — |
| Coated tool of Comparative Example | 22 α | — | — | — | — | — |
| | 23 β | TiC (1.0) | — | — | — | — |
| | 24 γ | TiN (2) | — | — | — | — |
| | 25 δ | TiN (1) | TiCN (3) | — | — | — |
| | 26 α | TiN (7) | TiCN (11) | TiCNO (2) | — | — |
| | 27 β | — | — | — | Al₂O₃ (5) | — |
| | 28 γ | TiC (2) | — | — | TiCN (10) | Al₂O₃ (15) |
| | 29 α | TiC (1) | — | — | TiCO (4) | Al₂O₃ (3) |
| | 30 α | TiN (0.1) | — | — | TiCNO (1) | Al₂O₃ (7) |
| | 31 β | — | — | — | — | — |
| | 32 γ | — | — | — | — | — |
| | 33 α | — | — | — | — | — |
| | 34 β | TiN (0.5) | — | — | TiCN (2.0) | Al₂O₃ (5) |

TABLE 15

| | | Hard coating layer TiAl complex carbonitride (TiAlCN layer) | | | |
|---|---|---|---|---|---|
| Type | Tool body symbol | TiAlCN film forming process formation symbol (see Tables 4 and 5 or Tables 6 and 7) | Average content ratio X of Al (atomic ratio) | Average content ratio Y of C (atomic ratio) | Average content ratio Z of Cl (atomic ratio) |
| Coated tool of the present invention | 18 α | A | 0.80 | 0 | 0.0014 |
| | 19 β | B | 0.60 | 0.003 | 0.0023 |
| | 20 γ | C | 0.95 | 0 | 0.0035 |
| | 21 δ | D | 0.75 | 0.003 | 0.0040 |
| | 22 α | E | 0.89 | 0.005 | 0.0023 |
| | 23 β | F | 0.90 | 0 | 0.0014 |
| | 24 γ | G | 0.73 | 0 | 0.0005 |
| | 25 δ | H | 0.67 | 0.001 | 0.0001 |
| | 26 α | I | 0.85 | 0.003 | 0.0016 |
| | 27 β | J | 0.73 | 0 | 0.0004 |
| | 28 γ | A | 0.78 | 0 | 0.0015 |
| | 29 α | B | 0.63 | 0.003 | 0.0027 |
| | 30 α | C | 0.94 | 0 | 0.0032 |
| | 31 β | D | 0.74 | 0.003 | 0.0040 |
| | 32 γ | E | 0.87 | 0.005 | 0.0026 |
| | 33 α | K | 0.81 | 0 | 0.0012 |
| | 34 β | L | 0.88 | 0.004 | 0.0020 |

| Type | Hard coating layer TiAl complex carbonitride (TiAlCN layer) | | | | | | | Target average layer thickness (μm) |
|---|---|---|---|---|---|---|---|---|
| | X-ray diffraction | | | | | Grain | | |
| | d (111) | d (200) | A (111) | A (200) | ΔA (Å) | width W (μm) | Aspect ratio A | |
| Coated tool of the present invention | | | | | | | | |
| 18 | 2.350 | 2.048 | 4.071 | 4.096 | 0.025 | 1.15 | 4.2 | 5.0 |
| 19 | 2.377 | 2.052 | 4.117 | 4.103 | 0.014 | 0.21 | 21.0 | 10.2 |
| 20 | 2.327 | 2.036 | 4.031 | 4.071 | 0.040 | 2.20 | 3.0 | 11.5 |
| 21 | 2.350 | 2.049 | 4.070 | 4.098 | 0.028 | 2.15 | 7.8 | 20.0 |
| 22 | 2.346 | 2.346 | 4.064 | 4.071 | 0.007 | 2.32 | 8.5 | 13.0 |
| 23 | 2.341 | 2.044 | 4.054 | 4.088 | 0.034 | 1.39 | 3.8 | 7.1 |
| 24 | 2.350 | 2.060 | 4.070 | 4.120 | 0.050 | 0.36 | 20.0 | 12.1 |
| 25 | 2.387 | 2.051 | 4.134 | 4.102 | 0.032 | 0.74 | 7.8 | 5.1 |

TABLE 15-continued

| | | | | | | | |
|---|---|---|---|---|---|---|---|
| 26 | 2.346 | 2.037 | 4.063 | 4.073 | 0.01 | 0.52 | 12.0 | 12.3 |
| 27 | 2.360 | 2.059 | 4.087 | 4.117 | 0.030 | 1.05 | 6.4 | 10.5 |
| 28 | 2.353 | 2.050 | 4.075 | 4.099 | 0.024 | 0.82 | 6.5 | 3.5 |
| 29 | 2.375 | 2.049 | 4.113 | 4.098 | 0.015 | 0.71 | 9.8 | 8.7 |
| 30 | 2.328 | 2.037 | 4.033 | 4.073 | 0.040 | 0.49 | 9.0 | 16.1 |
| 31 | 2.351 | 2.050 | 4.072 | 4.099 | 0.027 | 2.18 | 2.9 | 4.7 |
| 32 | 2.349 | 2.038 | 4.068 | 4.076 | 0.008 | 2.40 | 3.2 | 8.3 |
| 33 | 2.348 | 2.056 | 4.067 | 4.112 | 0.045 | 0.67 | 4.0 | 7.0 |
| 34 | 2.346 | 2.048 | 4.063 | 4.096 | 0.033 | 0.89 | 5.0 | 8.0 |

TABLE 16

| Type | | Tool body symbol | TiAlCN film forming process formation symbol (see Tables 4 and 5 or Tables 6 and 7) | Hard coating layer TiAl complex carbonitride (TiAlCN layer) | | |
|---|---|---|---|---|---|---|
| | | | | Average content ratio X of Al (atomic ratio) | Average content ratio Y of C (atomic ratio) | Average content ratio Z of Cl (atomic ratio) |
| Coated tool of Comparative Example | 18 | α | A' | 0.99* | 0 | 0.0080* |
| | 19 | β | B' | 0.49* | 0 | 0.0021 |
| | 20 | γ | C' | 0.90 | 0.009* | 0.0032 |
| | 21 | δ | D' | 0.69 | 0.005 | 0.0001 |
| | 22 | α | E' | 0.84 | 0 | 0.0022 |
| | 23 | β | F' | 0.84 | 0 | 0.0018 |
| | 24 | γ | G' | 0.79 | 0.007* | 0.0006 |
| | 25 | δ | H' | 0.59* | 0 | 0.0009 |
| | 26 | α | I' | 0.40* | 0 | 0.0053* |
| | 27 | β | J' | 0.96* | 0.012* | 0.0047* |
| | 28 | γ | A' | 0.98* | 0 | 0.0078* |
| | 29 | α | B' | 0.48* | 0 | 0.0024 |
| | 30 | α | C' | 0.93 | 0.010* | 0.0033 |
| | 31 | β | D' | 0.73 | 0.004 | 0.00008* |
| | 32 | γ | E' | 0.89 | 0 | 0.0025 |
| | 33 | α | K' | 0.97* | 0 | 0.0020 |
| | 34 | β | L' | 0.85 | 0 | 0.0010 |

| Type | | Hard coating layer TiAl complex carbonitride (TiAlCN layer) | | | | | Grain | | Target average layer |
|---|---|---|---|---|---|---|---|---|---|
| | | X-ray diffraction | | | | | | | |
| | | d (111) | d (200) | A (111) | A (200) | ΔA (Å) | width W (μm) | Aspect ratio A | thickness (μm) |
| Coated tool of Comparative Example | 18 | — | — | — | — | — | — | — | 2.2 |
| | 19 | 2.390 | 2.063 | 4.139 | 4.125 | 0.014 | 0.42 | 11.7 | 17.8 |
| | 20 | 2.332 | 2.040 | 4.039 | 4.079 | 0.04 | 0.81 | 11.3 | 20.1* |
| | 21 | 2.367 | 2.050 | 4.099 | 4.100 | 0.001* | 0.08 | 20.0 | 21.3* |
| | 22 | 2.354 | 2.039 | 4.077 | 4.077 | 0* | 1.31 | 15.0 | 22.3* |
| | 23 | 2.338 | 2.057 | 4.049 | 4.114 | 0.065* | 1.00 | 7.3 | 8.3 |
| | 24 | 2.337 | 2.064 | 4.048 | 4.128 | 0.08* | 0.38 | 4.0 | 15.7 |
| | 25 | 2.381 | 2.060 | 4.125 | 4.119 | 0.005* | 0.72 | 28.5 | 30* |
| | 26 | 2.405 | 2.071 | 4.166 | 4.141 | 0.025 | 0.10 | 3.3 | 1.0 |
| | 27 | 2.323 | 2.037 | 4.023 | 4.073 | 0.05 | 1.22 | 12.0 | 23.3* |
| | 28 | — | — | — | — | — | — | — | 25.7* |
| | 29 | 2.391 | 2.064 | 4.141 | 4.127 | 0.014 | 0.32 | 40.3 | 19.5 |
| | 30 | 2.328 | 2.037 | 4.033 | 4.073 | 0.04 | 0.65 | 14.2 | 14.0 |
| | 31 | 2.362 | 2.046 | 4.091 | 4.092 | 0.001* | 0.09 | 31.0 | 5.0 |
| | 32 | 2.349 | 2.034 | 4.068 | 4.068 | 0* | 1.05 | 7.3 | 11.5 |
| | 33 | — | — | — | — | — | — | — | 8.0 |
| | 34 | 2.351 | 2.034 | 4.068 | 4.072 | 0.004* | 0.13 | 8.3 | 9.1 |

(Note 1)
Mark *in boxes indicates a range beyond the range of the present invention.

(Note 2)
Mark - in boxes indicates that measurement cannot be performed because cubic was not observed.

Next, in a state in which each of the various coated tools was screwed to a tip end portion of an insert holder made of tool steel by a fixing tool, the coated tool of the present inventions 18 to 34 and the coated tool of Comparative Examples 18 to 34 were subjected to a wet high-speed intermittent cutting test for carbon steel • cast iron, which are described below, and the flank wear width of a cutting edge was measured.

Cutting conditions 1:
Work material: a round bar of JIS S55C with four longitudinal grooves formed with equal intervals in the longitudinal direction
Cutting speed: 370 m/min
Depth of cut: 1.2 mm
Feed rate: 0.2 mm/rev
Cutting time: 5 minutes
(a typical cutting speed is 220 m/min)
Cutting conditions 2:
Work material: a round bar of JIS FCD600 with four longitudinal grooves formed with equal intervals in the longitudinal direction
Cutting speed: 325 m/min
Depth of cut: 1.5 mm
Feed rate: 0.2 mm/rev
Cutting time: 5 minutes
(a typical cutting speed is 180 m/min)
The results of the cutting test are shown in Table 17.

layer, and the lattice strain satisfying $0.007\ \text{Å} \leq \Delta A \leq 0.05\ \text{Å}$ is not formed, abnormal damage such as chipping occurs or wear proceeds during high-speed intermittent cutting, resulting in the end of the service life within a short period of time.

INDUSTRIAL APPLICABILITY

As described above, the coated tool of the present invention can be used as a coated tool for various work materials as well as for high-speed intermittent cutting of alloy steel and further exhibits excellent cutting performance during long-term use, thereby sufficiently satisfying an improvement in performance of a cutting device, power saving and energy saving during cutting, and a further reduction in costs.

The invention claimed is:
1. A surface-coated cutting tool, comprising:
a tool body composed of any one of a tungsten carbide-based cemented carbide, a titanium carbonitride-based cermet and a cubic boron nitride-based sintered material; and
a hard coating layer provided on a surface of the tool body, wherein
(a) the hard coating layer includes at least a layer of complex nitride or complex carbonitride of Ti and Al having an average thickness of 1 to 20 μm, and in a case

TABLE 17

| Type | | Flank wear width (mm) | | Type | | Cutting test results (min) | |
| --- | --- | --- | --- | --- | --- | --- | --- |
| | | Cutting conditions 1 | Cutting conditions 2 | | | Cutting conditions 1 | Cutting conditions 2 |
| Coated tool of the present invention | 18 | 0.13 | 0.13 | Coated tool of Comparative Example | 18 | 1.7* | 2.2* |
| | 19 | 0.14 | 0.15 | | 19 | 2.5* | 2.5* |
| | 20 | 0.16 | 0.15 | | 20 | 4.6* | 4.7* |
| | 21 | 0.17 | 0.17 | | 21 | 4.8* | 4.7* |
| | 22 | 0.18 | 0.19 | | 22 | 2.6* | 3.2* |
| | 23 | 0.15 | 0.14 | | 23 | 4.2* | 4.4* |
| | 24 | 0.14 | 0.15 | | 24 | 4.5* | 4.3* |
| | 25 | 0.13 | 0.13 | | 25 | 2.7* | 2.8* |
| | 26 | 0.13 | 0.13 | | 26 | 3.3* | 3.1* |
| | 27 | 0.11 | 0.12 | | 27 | 2.9* | 3.2* |
| | 28 | 0.08 | 0.07 | | 28 | 1.8* | 2.1* |
| | 29 | 0.10 | 0.09 | | 29 | 3.9* | 3.4* |
| | 30 | 0.10 | 0.10 | | 30 | 4.2* | 4.2* |
| | 31 | 0.16 | 0.14 | | 31 | 4.1* | 4.0* |
| | 32 | 0.18 | 0.15 | | 32 | 4.3* | 4.2* |
| | 33 | 0.14 | 0.09 | | 33 | 1.9* | 2.0* |
| | 34 | 0.09 | 0.11 | | 34 | 4.2* | 4.5* |

Mark *in boxes of coated tool of Comparative Examples indicates a cutting time (min) until the end of a service life caused by the occurrence of chipping.

From the results shown in Tables 11 and 17, regarding the coated tools of the present invention, predetermined content ratio of Al, content ratio of C, content ratio of Cl are included in the cubic crystal grains of the AlTiCN layer, and the lattice strain satisfying $0.007\ \text{Å} \leq \Delta A \leq 0.05\ \text{Å}$ is formed, and accordingly high hardness is obtained. As a result, excellent wear resistance is exhibited during long-term use, without occurrence of chipping or fracture, even in a case of being used for high-speed intermittent cutting during which high-temperature heat is generated and intermittent and impact loads are exerted on a cutting edge.

Contrary to this, it is apparent that, regarding the coated tool of Comparative Examples in which the predetermined content ratio of Al, content ratio of C, content ratio of Cl are included in the cubic crystal grains configuring the AlTiCN where the complex nitride or the complex carbonitride is expressed by a composition formula:

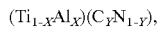

where X and Y satisfy $0.60 \leq X \leq 0.95$ and $0 \leq Y \leq 0.005$, respectively, X is an average content ratio of Al in a total amount of Ti and Al in an atomic ratio, and Y is an average content ratio of C in a total amount of C and N in an atomic ratio,
(b) the complex nitride or complex carbonitride contains Cl, and Z satisfies $0.0001 \leq Z \leq 0.004$, where Z is a content ratio of Cl in a total amount of Ti, Al, C, N, and Cl in an atomic ratio,
(c) in a case where values of spacing of plane d(111) and d(200) are respectively calculated from X-ray diffraction spectra of (111) plane and (200) plane of crystal grains having a NaCl type face-centered cubic structure in the layer of complex nitride or complex carbonitride measured by using an X-ray diffraction device, regarding the layer of complex nitride or complex carbonitride, A(111) and A(200), which are defined as A(111)= $3^{1/2}$d(111) and A(200)=2d(200), were calculated from the calculated values of d(111) and d(200), and an absolute value ΔA of a difference between A(111) and A(200) satisfies 0.007 Å≤ΔA≤0.05 Å, the absolute value being obtained from ΔA=|A(111)−A(200)|.

2. The surface-coated cutting tool according to claim 1, wherein, in a case where the layer of complex nitride or complex carbonitride is observed from a sectional side of the hard coating layer orthogonal to the surface of the tool body, the layer has a columnar structure in which an average grain width W of each crystal grain having a cubic structure in the layer of complex nitride or complex carbonitride is 0.10 to 2.00 μm, and an average aspect ratio A is 2.0 to 10.0.

3. The surface-coated cutting tool according to claim 1, further comprising: a lower layer between the tool body and the layer of the complex nitride or the complex carbonitride of Ti and Al, wherein the lower layer includes a Ti compound layer having one or more of: a Ti carbide layer; Ti nitride layer; Ti carbonitride layer; Ti oxycarbide layer; and Ti oxycarbonitride layer, the Ti compound layer having an average total thickness of 0.1 to 20 μm.

4. The surface-coated cutting tool according to claim 1, further comprising an upper layer above the layer of the complex nitride or the complex carbonitride, wherein the upper layer includes at least an aluminum oxide layer, the upper layer having an average total thickness of 1 to 25 μm.

5. The surface-coated cutting tool according to claim 1, wherein the absolute value ΔA is an index of a lattice strain of the complex nitride or complex carbonitride, and said lattice strain is formed in the complex nitride or complex carbonitride by a thermal chemical vapor deposition method using $NH_3$.

* * * * *